(12) United States Patent
Yamaguchi

(10) Patent No.: US 12,153,282 B2
(45) Date of Patent: Nov. 26, 2024

(54) PRISM, OPTICAL DEVICE, METHOD FOR MANUFACTURING PRISM, AND METHOD FOR MANUFACTURING PACKAGE DEVICE

(71) Applicant: NIPPON ELECTRIC GLASS CO., LTD., Otsu (JP)

(72) Inventor: Yoshimasa Yamaguchi, Otsu (JP)

( * ) Notice: Subject to any disclaimer, the term of this patent is extended or adjusted under 35 U.S.C. 154(b) by 591 days.

(21) Appl. No.: 17/419,316

(22) PCT Filed: Nov. 29, 2019

(86) PCT No.: PCT/JP2019/046688
§ 371 (c)(1),
(2) Date: Jun. 29, 2021

(87) PCT Pub. No.: WO2020/158150
PCT Pub. Date: Aug. 6, 2020

(65) Prior Publication Data
US 2022/0091364 A1    Mar. 24, 2022

(30) Foreign Application Priority Data

Jan. 31, 2019 (JP) ................................. 2019-015821
Sep. 11, 2019 (JP) ................................. 2019-165192

(51) Int. Cl.
*G02B 7/18*    (2021.01)
*G02B 5/04*    (2006.01)
*H01L 31/0203*    (2014.01)
*H01L 31/0232*    (2014.01)
(Continued)

(52) U.S. Cl.
CPC ............. *G02B 7/1805* (2013.01); *G02B 5/04* (2013.01); *H01L 31/0203* (2013.01); *H01L 31/02325* (2013.01); *H01L 33/486* (2013.01); *H01L 33/58* (2013.01)

(58) Field of Classification Search
CPC .... G02B 7/1805; G02B 7/181; G02B 7/1815; G02B 5/04; H01L 33/58
See application file for complete search history.

(56) References Cited

U.S. PATENT DOCUMENTS

| 6,271,049 B1 | 8/2001 | Auracher et al. |
| 8,787,714 B2 | 7/2014 | Morioka |
| 2007/0086092 A1 | 4/2007 | Jidai et al. |

(Continued)

FOREIGN PATENT DOCUMENTS

| CN | 105717564 B | 7/2017 |
| JP | 03-035213 A | 2/1991 |

(Continued)

OTHER PUBLICATIONS

Official Communication issued in corresponding Taiwanese Patent Application No. 108144674, mailed on May 23, 2023.

(Continued)

*Primary Examiner* — Ryan D Howard
(74) *Attorney, Agent, or Firm* — Keating & Bennett, LLP

(57) ABSTRACT

A prism is provided with which the positional accuracy can be effectively enhanced. The prism includes: a prism body 2 having a bottom surface 2a and an inclined surface 2b connected to the bottom surface 2a; and an adhesive film 3 provided on the bottom surface 2a, the adhesive film 3 including a first layer portion positioned on a side facing the prism body 2 and a second layer portion 6 including at least one of an Au layer or an Sn layer, the first layer portion 5 and the second layer portion 6 directly or indirectly stacked.

26 Claims, 8 Drawing Sheets

(51) Int. Cl.
    *H01L 33/48*    (2010.01)
    *H01L 33/58*    (2010.01)

(56) References Cited

U.S. PATENT DOCUMENTS

| | | |
|---|---|---|
| 2011/0310383 A1 | 12/2011 | Masson et al. |
| 2015/0219919 A1 | 8/2015 | Ouderkirk et al. |
| 2017/0003514 A1 | 1/2017 | Ouderkirk et al. |

FOREIGN PATENT DOCUMENTS

| | | |
|---|---|---|
| JP | 05-053033 A | 3/1993 |
| JP | 2000-091688 A | 3/2000 |
| JP | 2001-284696 A | 10/2001 |
| JP | 2003-014987 A | 1/2003 |
| JP | 2007-133375 A | 5/2007 |
| JP | 2009-045514 A | 3/2009 |
| JP | 4593717 B2 | 12/2010 |
| JP | 2013-239614 A | 11/2013 |
| TW | 629514 B | 7/2018 |

OTHER PUBLICATIONS

Official Communication issued in International Patent Application No. PCT/JP2019/046688, mailed on Feb. 10, 2020.

[FIG. 1.]
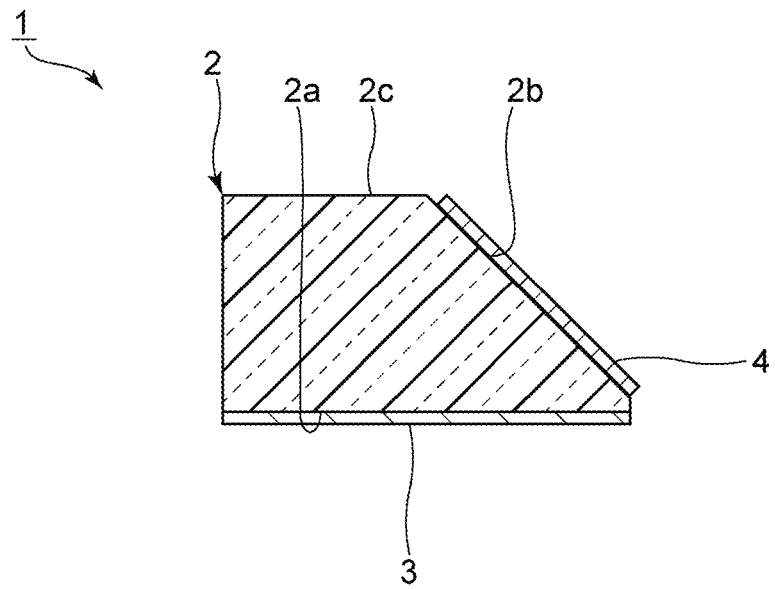
[FIG. 2.]
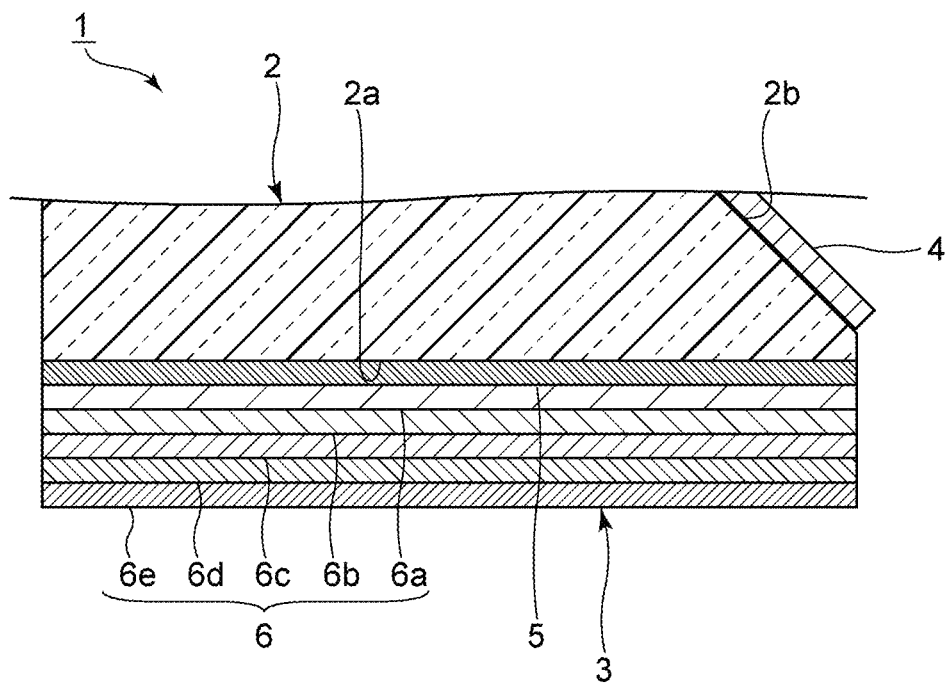

[FIG. 3.]
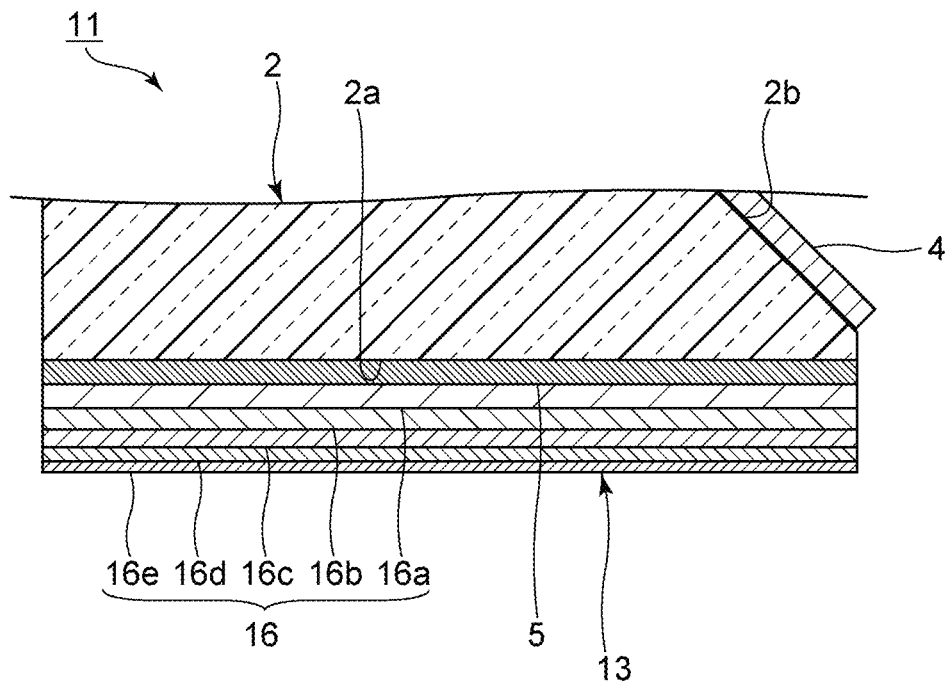
[FIG. 4.]
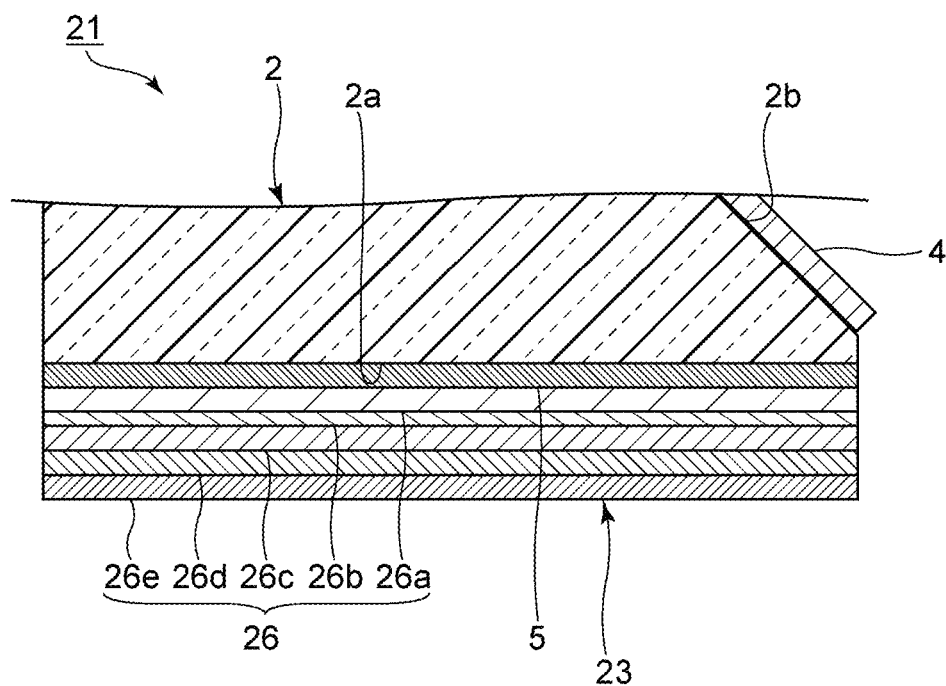

[FIG. 5.]
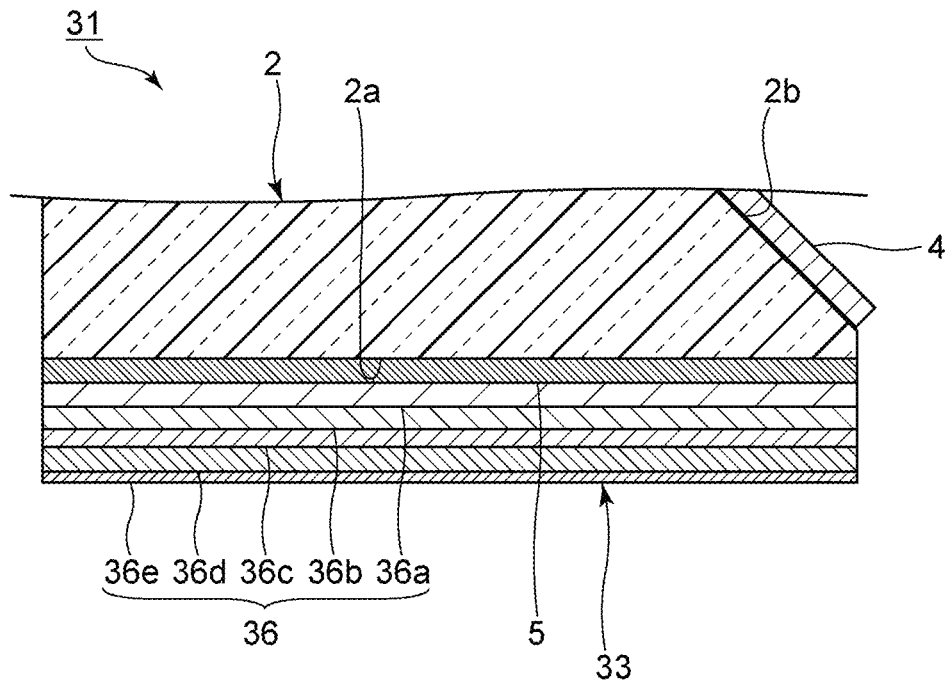
[FIG. 6.]
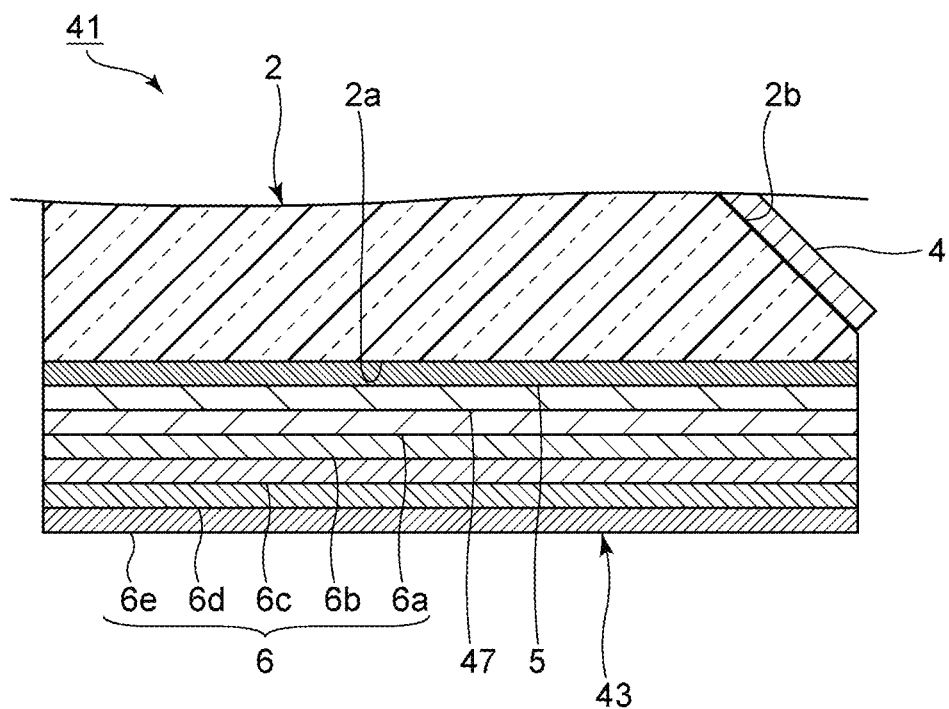

[FIG. 7.]
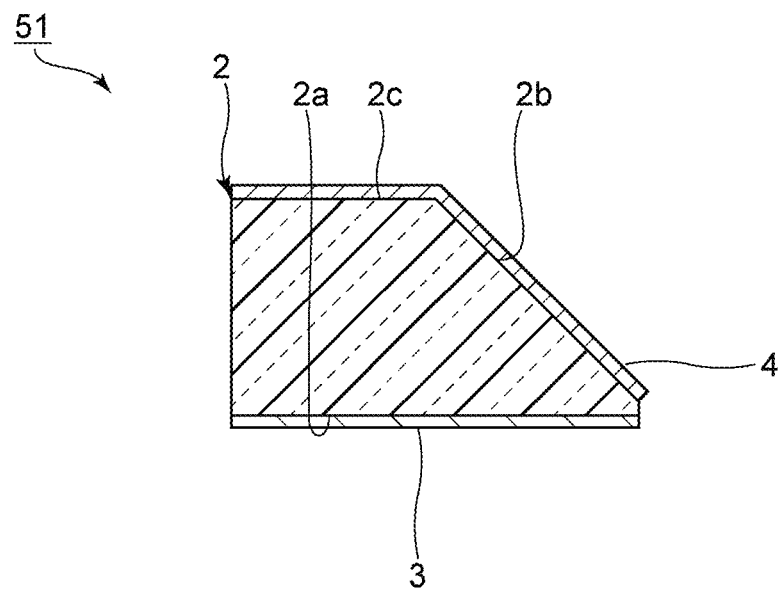
[FIG. 8.]
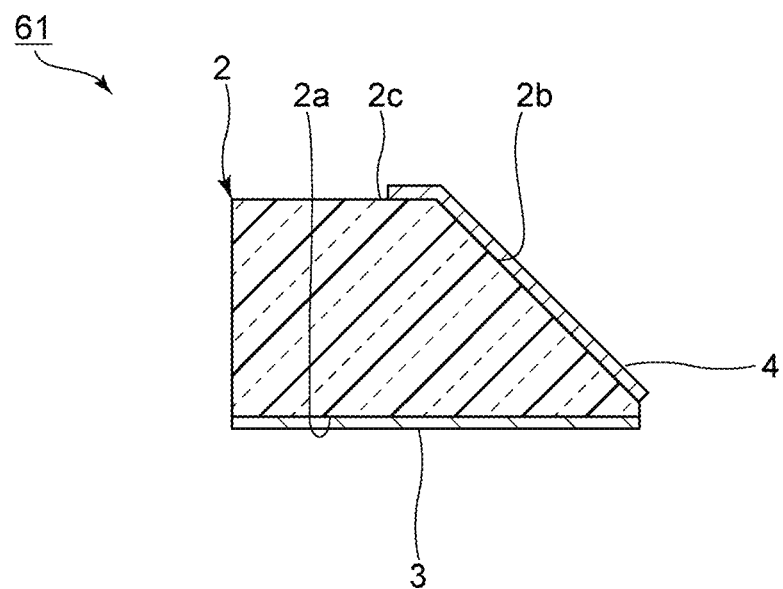

[FIG. 9.]
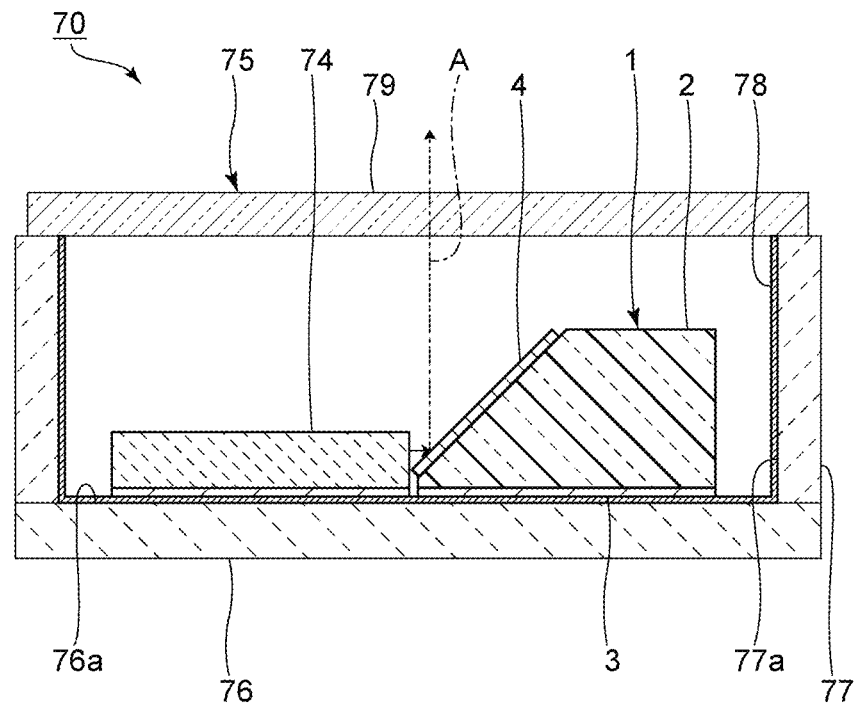
[FIG. 10.]
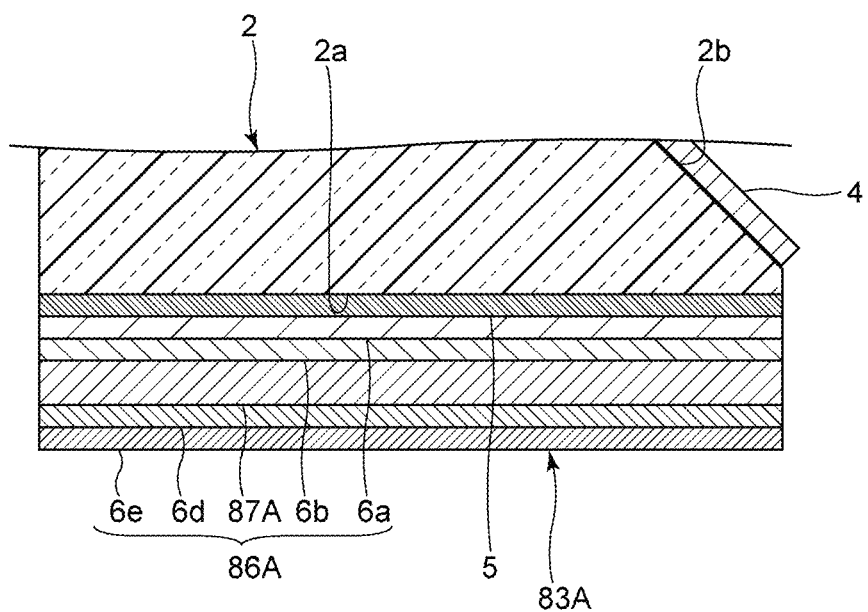

[FIG. 11.]
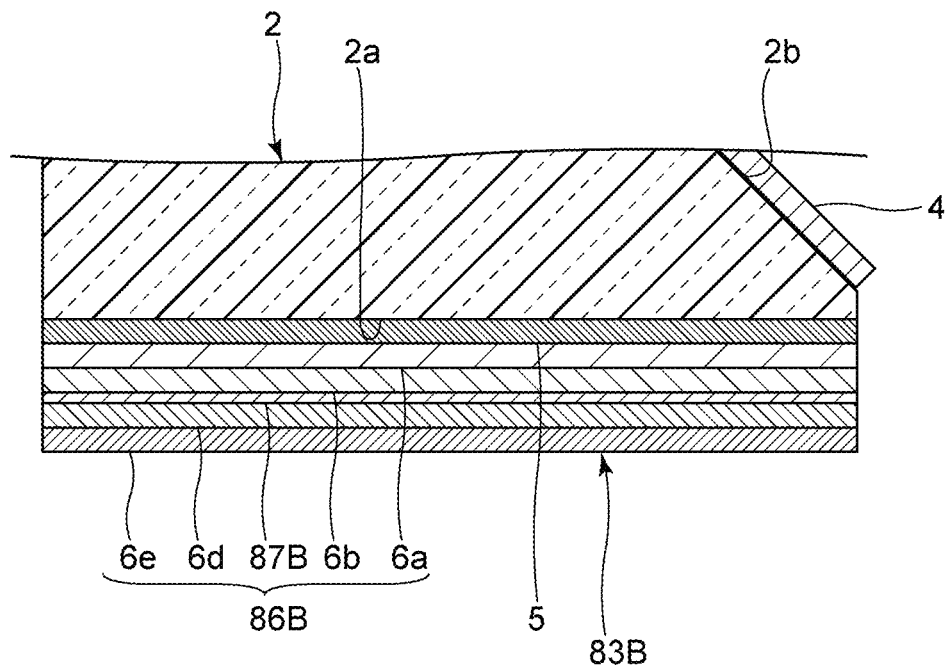
[FIG. 12.]
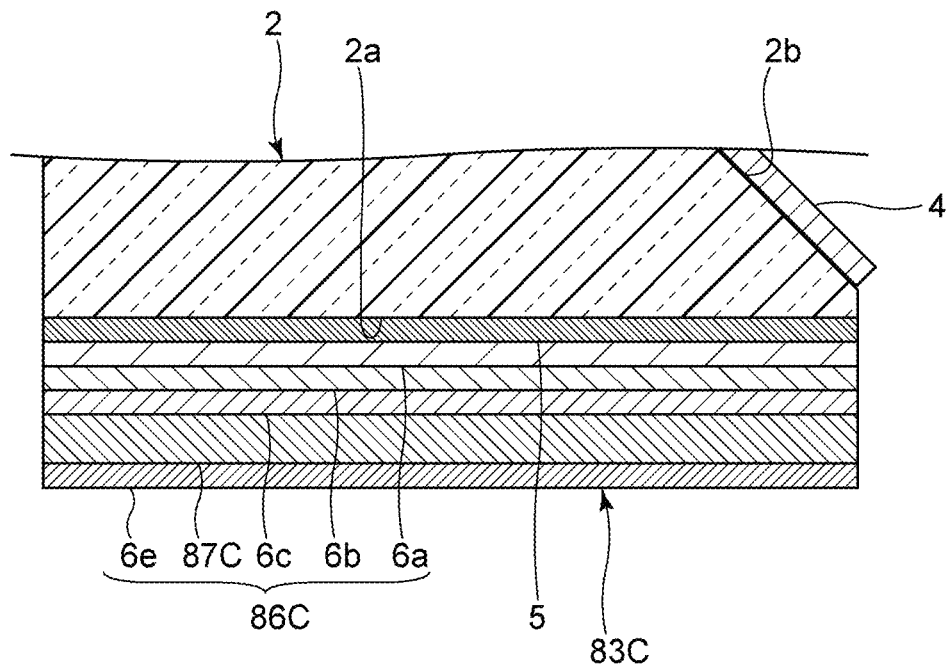

[FIG. 13.]
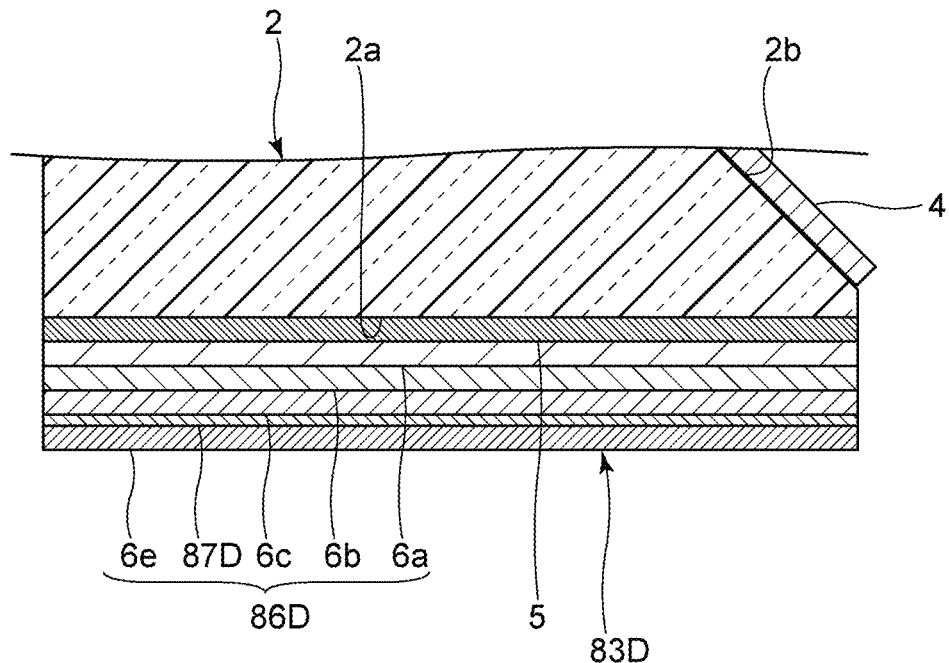
[FIG. 14.]
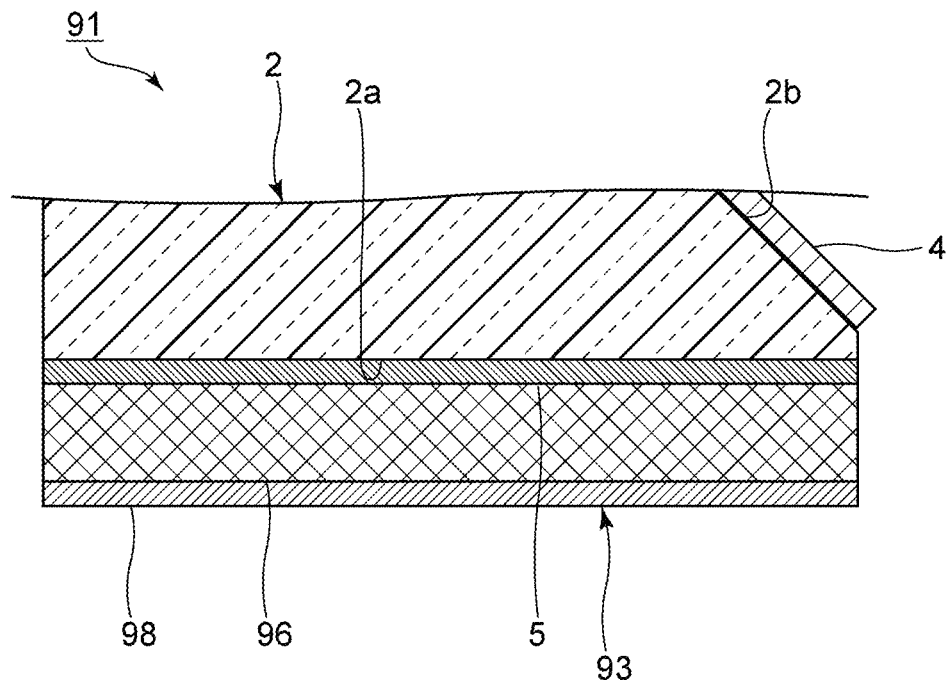

[FIG. 15.]
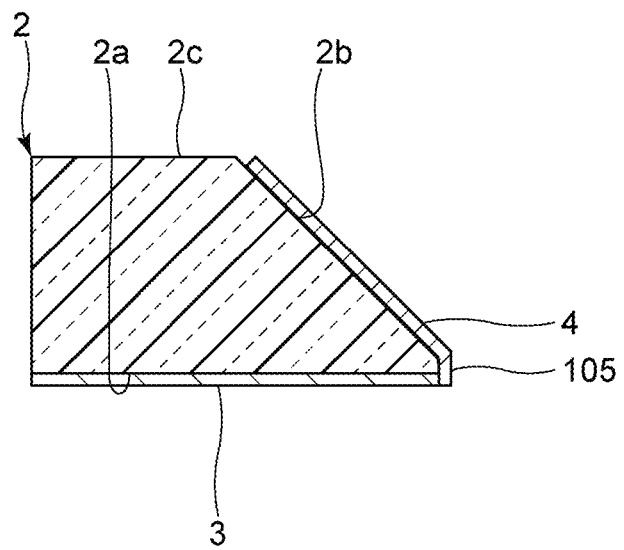
[FIG. 16.]
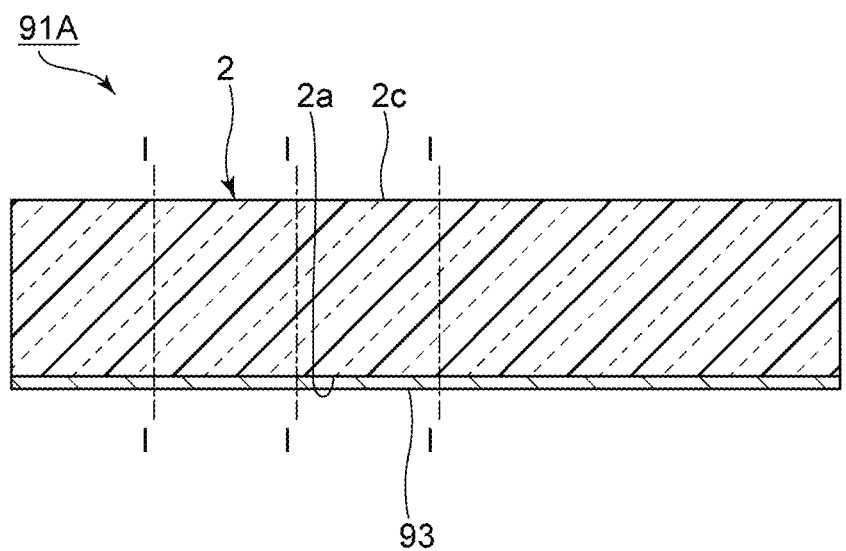

PRISM, OPTICAL DEVICE, METHOD FOR MANUFACTURING PRISM, AND METHOD FOR MANUFACTURING PACKAGE DEVICE

TECHNICAL FIELD

The present invention relates to a prism, an optical device, a method for manufacturing a prism, and a method for manufacturing a package device.

BACKGROUND ART

Prisms have been widely used recently for reflecting or refracting light from a light source in applications such as displays, automobile headlamps, and projectors. Patent Document 1 described below discloses an example of an optical device including such a prism. In Patent Document 1, a laser chip and a prism are arranged on a mounting substrate including a semiconductor disk. The laser chip and the prism are joined to the mounting substrate with solder.

PRIOR ART DOCUMENT

Patent Document

Patent Document 1: JP 2000-091688 A

SUMMARY OF THE INVENTION

Problem to be Solved by the Invention

In an optical device, the direction of the optical path is to be adjusted with high accuracy, and therefore, the prism is to be arranged and joined with high positional accuracy. However, in the case of using a high-output laser diode (LD) or the like as a light source for light emission to the prism, if the prism is arranged and joined on a mounting substrate or the like using an adhesive agent including a resin, the adhesive agent may be softened to cause displacement of the prism. In the case of mounting in which solder is used as described in Patent Document 1, melt flow of the whole solder occurs, so that displacement of the prism may be caused in the height direction before and after the mounting. Therefore, when the prism as described in Patent Document 1 is arranged and joined on a mounting substrate or the like, it is difficult to sufficiently enhance the positional accuracy. In addition, there is also a problem in terms of assembly workability, cost, and the like.

An object of the present invention is to provide a prism, an optical device in which the prism is used, a method for manufacturing a prism, and a method for manufacturing a package device. With the prism, the optical device, and the methods, the positional accuracy of the prism in the optical device can be effectively enhanced.

Means for Solving the Problem

The prism of the present invention includes: a prism body having a bottom surface and an inclined surface connected to the bottom surface; and an adhesive film provided on the bottom surface, the adhesive film including a first layer portion positioned on a side facing the prism body and a second layer portion including at least one of an Au layer or an Sn layer, the first layer portion and the second layer portion directly or indirectly stacked.

The Au layer and the Sn layer are preferably alternately stacked in the second layer portion.

It is preferable that the second layer portion include both the Au layer and the Sn layer, and an Au—Sn layer including an alloy of Au and Sn be provided between the Au layer and the Sn layer.

It is preferable that the second layer portion include the Au layer as an outermost layer on an outside that is a side far from the prism body in a stacking direction of the adhesive film.

It is preferable that the second layer portion include both a plurality of the Au layers and a plurality of the Sn layers alternately stacked, the second layer portion include a stress relaxation layer, the stress relaxation layer in a case that the stress relaxation layer is one of the plurality of the Au layers have a thickness different from an average thickness of a plurality of the Au layers other than the stress relaxation layer, and the stress relaxation layer in a case that the stress relaxation layer is one of the plurality of the Sn layers have a thickness different from an average thickness of a plurality of the Sn layers other than the stress relaxation layer. In this case, the stress relaxation layer more preferably has a thickness of ½ or more and 5 or less times the average thickness of the plurality of the Au or Sn layers other than the stress relaxation layer. Alternatively, the stress relaxation layer more preferably has a thickness of ⅕ or more and ½ or less times the average thickness of the plurality of the Au or Sn layers other than the stress relaxation layer.

It is preferable that the second layer portion include a layer thinner than any other layer in the second layer portion as the outermost layer on the outside that is the side far from the prism body in the stacking direction of the adhesive film. It is more preferable that a layer, in the second layer portion, positioned nearer to the outside be thinner.

It is preferable that the second layer portion include both a plurality of the Au layers and a plurality of the Sn layers, the plurality of the Au layers have the same thickness, and an Sn layer, in the plurality of the Sn layers, positioned nearer to the outside be thicker.

It is preferable that the second layer portion include both a plurality of the Au layers and a plurality of the Sn layers, an Au layer, in the plurality of the Au layers, positioned nearer to the outside be thinner, and the plurality of the Sn layers have the same thickness.

It is preferable that the second layer portion include 3 or more and 99 or less layers of the Au layer and the Sn layer in total. In this case, it is more preferable that the second layer portion include 15 or more and 35 or less layers of the Au layer and the Sn layer in total.

The adhesive film preferably has a total thickness of 1 µm or more and 10 µm or less.

It is preferable that the second layer portion include both the Au layer and the Sn layer, and have a total weight of Au, represented by $M_A$, and a total weight of Sn, represented by $M_S$, so that a ratio of the total weight of Au to a total weight of Au and Sn, represented by $M_A/(M_A+M_S)$, is 0.65 or more and 0.78 or less. The ratio is more preferably 0.60 or more and 0.75 or less.

A prism in another aspect of the present invention is a prism to be mounted on a package, the prism including: a prism body having a bottom surface and an inclined surface connected to the bottom surface; and an adhesive film provided on the bottom surface, the adhesive film including a first layer portion positioned on a side facing the prism body and a second layer portion being an Au—Sn layer including an alloy of Au and Sn, the second layer portion having a thickness of 2.5 µm or more and 5.9 µm or less, the first layer portion and the second layer portion directly or indirectly stacked.

It is preferable that the adhesive film include an outermost layer portion as an outermost layer on an outside that is a side far from the prism body in a stacking direction of the adhesive film, the second layer portion be laminated with the outermost layer portion, and the outermost layer portion be an Au layer.

It is preferable that the adhesive film include the outermost layer on the outside that is the side far from the prism body in the stacking direction of the adhesive film, the outermost layer having an arithmetic average roughness, represented by Ra, of 0.20 µm or less.

The first layer portion is preferably a Cr layer, a Ti layer, or a Ta film.

The adhesive film preferably further includes an intermediate layer portion interposed between the first layer portion and the second layer portion. In this case, the intermediate layer portion is more preferably an Ni layer, a Pt layer, a Pd layer, an Ni—Cr mixed layer, or an alloy layer in which Ni, Pt, Pd, Ni, and Cr are combined.

It is preferable that the prism body have a top surface, and the top surface be opposite from the bottom surface and be connected to the inclined surface.

A reflective film is preferably provided on the inclined surface of the prism body. Furthermore, a reflective film is preferably provided on the inclined surface and the top surface of the prism body.

The optical device of the present invention includes: the prism; an optical element that emits light to the prism or receives light from the prism; and a package that houses the prism and the optical element, and the prism is joined to the package via the adhesive film.

The method for manufacturing a prism of the present invention includes a step of providing an adhesive film on a bottom surface of a prism body having the bottom surface and an inclined surface connected to the bottom surface, the step including a step of forming a first layer portion including a metal material on the bottom surface and a step of directly or indirectly stacking the first layer portion and a second layer portion including a metal material. In the method, a component contained in the metal material included in the first layer portion is different from a component contained in the metal material included in the second layer portion, and the second layer portion includes at least one of an Au layer or an Sn layer.

The method for manufacturing a package device of the present invention includes: a step of preparing the prism; a step of preparing a package having an adhesive surface to be adhered to the prism; a step of bringing the prism and the package into contact with each other so that the adhesive film comes into contact with the adhesive surface of the package; and a step of heating the adhesive film to join the prism to the package.

It is preferable that an Au film be formed on the adhesive surface of the package, and the step of heating be performed at a temperature at which a whole of the adhesive film is not melted to join the prism to the package.

Effect of the Invention

According to the prism, the optical device, the method for manufacturing a prism, and the method for manufacturing a package device of the present invention, the positional accuracy of the prism can be effectively enhanced.

BRIEF DESCRIPTION OF THE DRAWINGS

FIG. 1 is a sectional view of a prism according to a first embodiment of the present invention.

FIG. 2 is an enlarged sectional view illustrating the vicinity of an adhesive film of the prism according to the first embodiment of the present invention.

FIG. 3 is an enlarged sectional view illustrating the vicinity of an adhesive film of a prism according to a second embodiment of the present invention.

FIG. 4 is an enlarged sectional view illustrating the vicinity of an adhesive film of a prism according to a third embodiment of the present invention.

FIG. 5 is an enlarged sectional view illustrating the vicinity of an adhesive film of a prism according to a fourth embodiment of the present invention.

FIG. 6 is an enlarged sectional view illustrating the vicinity of an adhesive film of a prism according to a fifth embodiment of the present invention.

FIG. 7 is a sectional view of a prism according to a sixth embodiment of the present invention.

FIG. 8 is a sectional view of a prism according to a modified example of the sixth embodiment of the present invention.

FIG. 9 is a sectional view of an optical device according to a seventh embodiment of the present invention.

FIG. 10 is a sectional view of a prism according to an eighth embodiment of the present invention.

FIG. 11 is a sectional view of a prism according to a ninth embodiment of the present invention.

FIG. 12 is a sectional view of a prism according to a tenth embodiment of the present invention.

FIG. 13 is a sectional view of a prism according to an eleventh embodiment of the present invention.

FIG. 14 is a sectional view of a prism according to a twelfth embodiment of the present invention.

FIG. 15 is a sectional view of a prism according to a thirteenth embodiment of the present invention.

FIG. 16 is a sectional view of a base material of a prism used for evaluation of stress.

MODE FOR CARRYING OUT THE INVENTION

Hereinafter, preferable embodiments will be described. However, the following embodiments are merely examples, and the present invention is not limited to the following embodiments. In the drawings, members having substantially the same function are sometimes referred to with the same reference symbol.

Prism

First Embodiment

FIG. 1 is a sectional view of a prism according to a first embodiment of the present invention. As illustrated in FIG. 1, a prism 1 includes a prism body 2, an adhesive film 3, and a reflective film 4. The prism body 2 has a substantially trapezoidal sectional shape. The prism body 2 has a bottom surface 2a, an inclined surface 2b connected to the bottom surface 2a, and a top surface 2c opposite from the bottom surface 2a and connected to the inclined surface 2b. Note that the sectional shape of the prism body 2 is not limited to a substantially trapezoidal shape, and may be a shape such as a substantially triangular shape. In the present embodiment, the prism body 2 includes an appropriate glass material.

The adhesive film 3 is provided on the bottom surface 2a of the prism body 2. The reflective film 4 is provided on the inclined surface 2b of the prism body 2. The prism 1 is to be joined to a mounting substrate, a package, or the like in an optical device or a package device via the adhesive film 3.

FIG. 2 is an enlarged sectional view illustrating the vicinity of the adhesive film of the prism according to the first embodiment. As illustrated in FIG. 2, the adhesive film 3 is a laminate of a plurality of metal layers. The adhesive film 3 specifically includes a first layer portion 5 positioned on the side facing the prism body 2 and a second layer portion 6 in the state that the first layer portion 5 and the second layer portion 6 are stacked. In the present embodiment, the first layer portion 5 and the second layer portion 6 are directly stacked. The first layer portion 5 and the second layer portion 6 may be indirectly stacked with another layer interposed therebetween.

The first layer portion 5 is a Cr layer. However, the first layer portion 5 is not limited to a Cr layer as long as the first layer portion 5 has a relatively high adhesion property to the prism body 2 in the layers of the adhesive film 3. For example, the first layer portion 5 may be a Ti layer or a Ta layer.

In the present invention, each metal layer may contain small amounts of an impurity and an additive. Specifically, the Cr layer is a metal layer containing 95 wt % or more of Cr. The Ti layer is a metal layer containing 95 wt % or more of Ti. The Ta layer is a metal layer containing 95 wt % or more of Ta. Cr, Ti, and Ta function as an adhesive layer to glass, and if the contents of Cr, Ti, and Ta are in the above-described ranges, an effect of the present invention is not impaired.

In the present embodiment, the second layer portion 6 is a laminate in which a first layer 6a, a second layer 6b, a third layer 6c, a fourth layer 6d, and a fifth layer 6e are stacked in this order. Here, in the stacking direction of the adhesive film 3, the inside is defined as the side near to the prism body 2, and the outside is defined as the side far from the prism body 2. In the second layer portion 6, the fifth layer 6e is the outermost layer.

The first layer 6a is an Au layer, the second layer 6b is an Sn layer, the third layer 6c is an Au layer, the fourth layer 6d is an Sn layer, and the fifth layer 6e as the outermost layer is an Au layer. The Au layers and the Sn layers are alternately stacked in the second layer portion 6. The second layer portion 6 is to include at least one of the Au layer or the Sn layer, and the number of layers is not limited to the above-described number.

In the present invention, the Au layer is a metal layer containing 95 wt % or more of Au. The Sn layer is a metal layer containing 95 wt % or more of Sn. The possibility that the metal layer contains an impurity depends on the degree of purification of Au or Sn. Representative examples of the impurity include Fe, Cr, and Ni. An effect of the present invention is not impaired as long as the contents of Au and Sn are in the above-described ranges.

The reflective film 4 includes, for example, a dielectric multilayer film in which a high refractive index film and a low refractive index film are alternately stacked. Examples of the material of the high refractive index film include $TiO_2$, $Ta_2O_5$, $ZrO_2$, and $HfO_2$. Examples of the material of the low refractive index film include $SiO_2$ and $MgF_2$. As the reflective film 4, a metal film may be used. The reflective film 4 is to be provided on at least a part of the inclined surface 2b of the prism body 2, and may be provided on, for example, the entire inclined surface 2b. The reflective film 4 provided on the inclined surface 2b can suitably reflect the light emitted from a light source. Note that the prism 1 is not necessarily to include the reflective film 4.

The adhesive film 3 and the reflective film 4 can be formed through stacking layers with, for example, a sputtering method or a vacuum deposition method.

The present embodiment is characterized by that the adhesive film 3 provided on the bottom surface 2a of the prism body 2 includes the first layer portion 5 and the second layer portion 6 including at least one of the Au layer or the Sn layer. The characteristic allows the positional accuracy of the prism 1 in an optical device to be effectively enhanced. Details of this will be described below.

The prism 1 of the present embodiment can be joined to a package or the like without melt flow of the entire adhesive film 3. Specifically, first, the prism 1 is placed on a package or the like as illustrated in FIG. 9. The prism 1 is specifically placed on an adhesive surface to which the prism 1 is adhered in a package or the like. At this time, a metal film such as an Au film is preferably provided, as an auxiliary layer for assistance of joining to the adhesive film 3, on a portion on which the prism 1 is placed (the inner surface of the package in the present embodiment). Next, the adhesive film 3 of the prism 1 is heated at a temperature at which the whole of the adhesive film 3 is not melted. The heating temperature is not particularly limited, and may be, for example, 300° C. or more and 350° C. or less. Through the heating of the adhesive film 3, the metals in the Au layer and the Sn layer are mutually diffused and alloyed in the adhesive film 3. At this time, the Au film that is the metal film on the inner surface of the package is adhered to the Au layer that is the outermost layer of the adhesive film 3 through mutual diffusion, and the metals in the Au layer and the Sn layer included in the adhesive film 3 are also mutually diffused and alloyed. As a result, the adhesive film 3 and the metal film of the package or the like are integrated to join the prism 1 to the package or the like. In this way, for example, a package device can be suitably manufactured. Alternatively, the prism 1 used in an optical device can be mounted on a package or the like.

As described above, the entire adhesive film 3 is not melted, so that the thickness of the adhesive film 3 rarely changes before and after joining of the prism 1, and displacement of the prism body 2 rarely occurs in the height direction. Furthermore, because the entire adhesive film 3 is not melted, displacement of the prism body 2 rarely occurs also in the horizontal direction before and after joining of the prism 1. Therefore, the positional accuracy of the prism 1 can be effectively enhanced. Furthermore, in the assembly process of a package, the conventional step of applying solder can be omitted, that is, it is enough that the prism 1 including the adhesive film 3 is placed on the package or the like, so that the workability and the cost efficiency can be improved.

Furthermore, unlike an adhesive agent including a resin, the adhesive film 3 includes a metal. Therefore, deterioration due to moisture or oxygen and deterioration due to light rarely occur, and the reliability can be enhanced. In addition, no gas is generated after joining the prism 1 to the package or the like, and as a result, an impurity rarely adheres to the reflective film 4 and the optical element 74 described below, and the reflectance and the transmittance rarely deteriorate.

Note that, although the case has been exemplified above in which the adhesive film 3 is heated for joining in a state that the prism 1 is placed on the package, the position and the state of the package and the prism 1 at the time of joining are not limited to those described above as long as the adhesive film 3 of the prism 1 is in contact with the adhesive surface of the package. For example, an aspect may be such that the package is placed on the prism 1, or a state may be such that the prism 1 and the package in contact with each other are sandwiched by a clamp device or the like.

In the adhesive film 3, the Au layer and the Sn layer are preferably alternately stacked. As a result, at the time of mounting, the metals in the Au layer and the Sn layer can be mutually diffused and alloyed further reliably. Therefore, when the prism 1 is mounted on a package or the like, the joining strength by the adhesive film 3 can be further reliably enhanced.

The adhesive film 3 preferably has a total thickness of 1 μm or more, and more preferably 3 μm or more. As a result, the joining strength can be further sufficiently enhanced. The adhesive film 3 preferably has a total thickness of 10 μm or less, and more preferably 5 μm or less. In this case, the layers in which the metals are mutually diffused can be each thin at the time of mounting. As a result, it is possible to shorten the time for mutual diffusion, such that the layers in the adhesive film 3 are not separated, of the metals in the layers, and it is possible to shorten the time for alloying the metals in the adhesive film 3. Therefore, the productivity can be further enhanced. Furthermore, the displacement of the prism body in the height direction is reduced because the used adhesive film 3 is thin, so that the positional accuracy of the prism 1 can be further effectively enhanced.

The second layer portion 6 in the adhesive film 3 preferably includes 3 or more, and more preferably 15 or more of the Au layer and the Sn layer in total. As a result, the thickness of each layer in the second layer portion 6 can be further reduced. Therefore, at the time of mounting, the time for alloying the metals in the adhesive film 3 can be further shortened, and the productivity can be further enhanced.

The second layer portion 6 preferably includes 99 or less of the Au layer and the Sn layer in total. In consideration of the productivity, the number of the layers is more preferably 39 or less, and still more preferably 35 or less. If the number of the layers in the second layer portion 6 is too large, each layer is too thin, and therefore may be difficult to form.

The second layer portion 6 may include an Au—Sn layer that is interposed between the Au layer and the Sn layer and includes an alloy of Au and Sn. In this case, at the time of mounting, the time for alloying the metals in the adhesive film 3 can be further effectively shortened, and the productivity can be further effectively enhanced. The Au—Sn layer can be formed in a short time through co-deposition or co-sputtering using a vacuum deposition method or a sputtering method.

The Au—Sn layer can be formed through alloying a part of the metals in the Au layer and the Sn layer adjacent to each other during formation of the adhesive film 3. For example, under an appropriate condition of a method such as a sputtering method or a vacuum deposition method, energy applied for stacking the Au layer and the Sn layer can be used for alloying a part of the metals in the Au layer and the Sn layer to form an Au—Sn layer.

The outermost layer in the second layer portion 6 is preferably an Au layer. As a result, at the time of mounting, the outermost layer in contact with a package or the like rarely oxidizes to enhance the joining strength further reliably.

Here, the total weight of Au in the adhesive film 3 is represented by $M_A$, the total weight of Sn is represented by $M_S$, and the ratio of the total weight of Au to the total weight of Au and Sn is represented by $M_A/(M_A+M_S)$. At this time, the ratio $M_A/(M_A+M_S)$ is preferably more than 0.78 and less than 0.82, and particularly preferably 0.8. In this case, the melting points (eutectic temperature) of Au and Sn can be about 280° C., and the metals in the adhesive film 3 can be alloyed at a low temperature. Therefore, the prism 1 can be joined to a package or the like at a low temperature.

Here, as described above, a metal film such as an Au film is preferably formed on a package or the like on which the prism 1 is mounted. When the prism 1 is joined to the portion on which the Au film is formed in the package or the like, Au enters the adhesive film 3 from the Au film. Therefore, the ratio of the weight of Au in the adhesive film 3, $M_A/(M_A+M_S)$ after alloying is larger than the ratio before alloying. Therefore, in such a case, the ratio of the weight of Au in the adhesive film 3, $M_A/(M_A+M_S)$ is preferably 0.60 or more and 0.78 or less, and more preferably 0.68 or more and 0.75 or less. By setting the ratio in the adhesive film 3, $M_A/(M_A+M_S)$ before alloying within the above-described range, it is possible to set the ratio in the adhesive film 3, $M_A/(M_A+M_S)$ after alloying the metals in the Au film and the adhesive film 3 within the range of more than 0.78 and less than 0.82. As a result, the melting points (eutectic temperature) of Au and Sn can be about 280° C., and the metals in the adhesive film 3 can be alloyed at a low temperature. Therefore, the prism 1 can be further reliably joined to a package or the like at a low temperature.

As in the present embodiment, the prism body 2 preferably has the top surface 2c that is opposite from the bottom surface 2a and is connected to the inclined surface 2b. In this case, the prism 1 is easily chucked when moved, and therefore can be easily mounted. Note that the prism body 2 is not necessarily to have the top surface 2c, and may have a sectional shape such as a substantially triangular shape.

Second Embodiment

FIG. 3 is an enlarged sectional view illustrating the vicinity of an adhesive film of a prism according to a second embodiment of the present invention. As illustrated in FIG. 3, a prism 11 of the present embodiment is different from the prism of the first embodiment in that a layer positioned nearer to the outside is thinner in a second layer portion 16 in an adhesive film 13. Specifically, when the thickness of a first layer 16a is represented by $T_a$, the thickness of a second layer 16b is represented by $T_b$, the thickness of a third layer 16c is represented by $T_c$, the thickness of a fourth layer 16d is represented by $T_d$, and the thickness of a fifth layer 16e is represented by $T_e$, $T_a > T_b > T_c > T_d > T_e$. Except for the above-described point, the prism 11 of the present embodiment has the same configuration as the prism 1 of the first embodiment.

Also in the present embodiment, the prism 11 can be joined to a package or the like without melt of the adhesive film 13 in the same manner as in the first embodiment. Therefore, the positional accuracy of the prism 11 can be effectively enhanced.

The fifth layer 16e is the outermost layer, so that the layer adjacent to the fifth layer 16e is only the fourth layer 16d positioned inside. Therefore, in alloying the metals in the adhesive film 13, mutual diffusion occurs through both the outside and the inside surfaces in the third layer 16c and the fourth layer 16d, but in the fifth layer 16e, mutual diffusion occurs through only the inside surface. Here, in the present embodiment, the fifth layer 16e is the thinnest layer in the second layer portion 16. Therefore, the time for mutual diffusion for alloying the metals in the fifth layer 16e can be effectively shortened. As a result, the metals in the fifth layer 16e can be further reliably alloyed, and the time for alloying can be shortened. Therefore, the metals in the adhesive film 13 can be further reliably alloyed, the joining strength can be further reliably enhanced, and the productivity can be enhanced.

In the second layer portion 16 in the adhesive film 13, a layer positioned nearer to the outside is thinner. As a result, even if the fifth layer 16e is thin, the metals in the layers other than the fifth layer 16e can be further reliably alloyed. Therefore, the metals in the adhesive film 13 can be further reliably alloyed, and the joining strength can be further reliably enhanced.

In the second layer portion 16, when the fifth layer 16e is the thinnest layer, at least two layers may have the same thickness. The relationship between the thicknesses of the layers in the second layer portion 16 may be $T_a \geq T_b \geq T_c \geq T_d > T_e$.

Third Embodiment

FIG. 4 is an enlarged sectional view illustrating the vicinity of an adhesive film of a prism according to a third embodiment of the present invention. The thickness of each layer in the adhesive film may be changed as follows from the thickness in the first embodiment. For example, a prism 21 of the present embodiment may have a configuration in which the thicknesses of a plurality of Au layers are the same in a second layer portion 26 in an adhesive film 23, and in a plurality of Sn layers, an Sn layer positioned nearer to the outside is thicker. Specifically, when the thickness of a first layer 26a is represented by $T_a$, the thickness of a second layer 26b is represented by $T_b$, the thickness of a third layer 26c is represented by $T_c$, the thickness of a fourth layer 26d is represented by $T_d$, and the thickness of a fifth layer 26e is represented by $T_e$, the thicknesses of the Au layers are $T_a = T_c = T_e$, and the thicknesses of the Sn layers are $T_b < T_d$. Except for the above-described point, the prism 21 of the present embodiment has the same configuration as the prism 1 of the first embodiment.

Also in the present embodiment, the prism 21 can be joined to a package or the like without melt flow of the entire adhesive film 23 in the same manner as in the first embodiment. Furthermore, when the metals in the adhesive film 23 are alloyed, the weight ratio of Sn can be higher in the outside than in the inside, and the positional accuracy of the prism 21 can be further effectively enhanced.

Fourth Embodiment

FIG. 5 is an enlarged sectional view illustrating the vicinity of an adhesive film of a prism according to a fourth embodiment of the present invention. The thickness of each layer in the adhesive film may be changed as follows from the thickness in the first embodiment. For example, a prism 31 of the present embodiment may have a configuration in which in a plurality of Au layers in a second layer portion 36 in an adhesive film 33, an Au layer positioned nearer to the outside is thinner, and the thicknesses of a plurality of Sn layers are the same. Specifically, when the thickness of a first layer 36a is represented by $T_a$, the thickness of a second layer 36b is represented by $T_b$, the thickness of a third layer 36c is represented by $T_c$, the thickness of a fourth layer 36d is represented by $T_d$, and the thickness of a fifth layer 36e is represented by $T_e$, the thicknesses of the Au layers are $T_a > T_c > T_e$, and the thicknesses of the Sn layers are $T_b = T_d$. Except for the above-described point, the prism 31 of the present embodiment has the same configuration as the prism 1 of the first embodiment.

Also in the present embodiment, the prism 31 can be joined to a package or the like without melt flow of the entire adhesive film 33 in the same manner as in the first embodiment. Furthermore, when the metals in the adhesive film 33 are alloyed, the weight ratio of Sn can be higher in the outside than in the inside, and the positional accuracy of the prism 31 can be further effectively enhanced.

Fifth Embodiment

FIG. 6 is an enlarged sectional view illustrating the vicinity of an adhesive film of a prism according to a fifth embodiment of the present invention. As illustrated in FIG. 6, a prism 41 of the present embodiment is different from the prism of the first embodiment in that an adhesive film includes an intermediate layer portion 47 interposed between a first layer portion 5 and a second layer portion 6. Except for the above-described point, the prism 41 of the present embodiment has the same configuration as the prism 1 of the first embodiment.

In the present embodiment, the first layer portion 5 and the second layer portion 6 are indirectly stacked with the intermediate layer portion 47 interposed therebetween. Due to the intermediate layer portion 47 included in the adhesive film 43, the metal in the second layer portion 6 rarely diffuses into the first layer portion 5. Therefore, the adhesive film 43 rarely separates from the prism body 2.

The intermediate layer portion 47 is preferably an Ni layer, a Pt layer, a Pd layer, an Ni—Cr mixed layer, or an alloy layer in which Ni, Pt, Pd, Ni, and Cr are combined. As a result, the metal in the second layer portion 6 further rarely diffuses into the first layer portion 5, and the adhesive film 43 further rarely separates from the prism body 2.

In the present invention, the Ni layer is a metal layer containing 90 wt % or more of Ni. The Pt layer is a metal layer containing 90 wt % or more of Pt. The Pd layer is a metal layer containing 90 wt % or more of Pd. These layers function as a barrier layer. It is considered that a layer containing 90 wt % or more of Ni, Pt, Pd, or an alloy of these metals can function as a barrier layer.

Furthermore, the prism 41 can be joined to a package or the like without melt flow of the entire adhesive film 43 in the same manner as in the first embodiment. Therefore, the positional accuracy of the prism 41 can be effectively enhanced.

Sixth Embodiment

FIG. 7 is a sectional view of a prism according to a sixth embodiment of the present invention. As illustrated in FIG. 7, a prism 51 of the present embodiment is different from the prism of the first embodiment in that a reflective film 4 is provided on an inclined surface 2b and a top surface 2c of a prism body 2. Specifically, the reflective film 4 is continuously provided from the inclined surface 2b to the top surface 2c. Except for the above-described point, the prism 51 of the present embodiment has the same configuration as the prism 1 of the first embodiment.

Also in the present embodiment, an adhesive film 3 similar to that of the first embodiment is included, and therefore, the positional accuracy of the prism 51 can be effectively enhanced.

It is desirable that at the time of mounting the prism 51, the position of the prism 51 be visually recognized with a camera. As a result, the positional accuracy of the prism 51 can be enhanced. Furthermore, in the present embodiment, the reflective film 4 is provided on the top surface 2c of the prism body 2. Thus, the reflective film 4 reflects light to the camera side. Therefore, the luminance of the prism 51 can be enhanced, and the prism 51 can be easily visually recognized with the camera. Therefore, the position of the prism 51 can be further reliably confirmed to enhance the positional accuracy of the prism 51 further reliably.

In the present embodiment, the reflective film 4 is provided on the entire top surface 2c of the prism body 2. However, the reflective film 4 may be provided on a part of the top surface 2c. In a prism 61, illustrated in FIG. 8, according to a modified example of the sixth embodiment, a reflective film 4 extends from the inclined surface of a prism body 2 to a part of a top surface 2c. Also in this case, at the time of mounting, the position of the prism 61 can be further reliably confirmed to enhance the positional accuracy of the prism 61 further reliably.

In the prism 51 illustrated in FIG. 7, the reflective film 4 on the inclined surface 2b and the top surface 2c is integrally provided. Note that the reflective film 4 provided on the inclined surface 2b and the reflective film 4 provided on the top surface 2c may be separate.

Optical Device

Seventh Embodiment

FIG. 9 is a sectional view of an optical device according to a seventh embodiment of the present invention. As illustrated in FIG. 9, an optical device 70 includes the prism 1 of the first embodiment, an optical element 74, and a package 75 that houses the prism 1 and the optical element 74.

In the present embodiment, the optical element 74 is a light source that emits light to the prism 1. The light source is not particularly limited, and for example, an LD, a light emitting diode (LED), or the like can be used. Note that the optical element 74 may be a light receiving element that receives light from the prism 1.

The package 75 is a container-shaped member having a bottom portion 76 and a side wall portion 77 arranged on the bottom portion 76. The package 75 includes, for example, a ceramic material, and specifically includes alumina, aluminum nitride, or the like. The bottom portion 76 has a mounting surface 76a. The optical element 74 and the prism 1 are arranged on the mounting surface 76a of the bottom portion 76. The side wall portion 77 has an inner surface 77a and an outer surface. A metal film 78 is provided on the mounting surface 76a of the bottom portion 76 and the inner surface 77a of the side wall portion 77. In the present embodiment, the metal film 78 is specifically an Au film. Note that the metal film 78 is not limited to an Au film.

The prism 1 is joined to the mounting surface 76a of the package 75 via an adhesive film 3. The optical element 74 may be joined to the mounting surface 76a with a joining material such as solder. The joining material is not particularly limited.

The package 75 is not necessarily to include the metal film 78. However, the package 75 preferably includes the metal film 78 as in the present embodiment. Alloying the metals in the adhesive film 3 of the prism 1 and the metal film 78 leads to further reliable and effective enhancement of the joining strength between the prism 1 and the package 75. Such a configuration is particularly effective in the case that the difference in thermal expansion coefficient between the prism 1 and the package 75 is relatively large.

The metal film 78 is preferably an Au film. As a result, the metal film 78 rarely oxidizes. Therefore, in manufacturing the optical device 70, the joining strength between the prism 1 and the package 75 can be further reliably enhanced.

In the present embodiment, the metal film 78 is provided on the entire mounting surface 76a of the bottom portion 76 and the inner surface 77a of the side wall portion 77. However, the metal film 78 is to be provided at least at a portion on which the prism 1 is arranged.

A lid 79 is provided on the side wall portion 77 of the package 75 so as to enclose the optical element 74 and the prism 1. The lid 79 is not particularly limited, and is a glass lid in the present embodiment.

The method of joining the lid 79 to the package 75 is not particularly limited, and in the present embodiment, the lid 79 is joined to the package 75, for example, through SnNi joining. In this case, no gas is generated after joining, and as a result, an impurity rarely adheres to the reflective film 4 of the prism 1, and the reflectance rarely deteriorates. The above-described method of joining is an example, and the lid 79 may be joined to the package 75 through SnAg joining or SnAgCu joining.

As illustrated in FIG. 9, the light A emitted from the optical element 74 is reflected by the prism 1, passes through the lid 79, and is emitted outside the optical device 70.

The optical device 70 includes the prism 1 of the first embodiment, and therefore, the positional accuracy of the prism 1 in the optical device 70 can be effectively enhanced. [0086]

The optical device 70 may be used in a multi-chip. The multi-chip includes, for example, a mounting substrate and a plurality of optical devices 70 arranged on the mounting substrate. The optical device in the multi-chip includes the prism 1 of the first embodiment, and therefore, the positional accuracy of the prism 1 can be effectively enhanced also in the multi-chip.

Prism

Eighth Embodiment

FIG. 10 is a sectional view of a prism according to an eighth embodiment. As illustrated in FIG. 10, a prism of the present embodiment is different from the prism of the first embodiment in that a second layer portion 86A in an adhesive film 83A includes a stress relaxation layer 87A. The stress relaxation layer 87A specifically corresponds to a third layer that is one of a plurality of Au layers. Except for the above-described point, the prism of the present embodiment has the same configuration as the prism 1 of the first embodiment.

The stress relaxation layer 87A has a thickness different from the average thickness of the other Au layers, that is, of a first layer 6a and a fifth layer 6e. More specifically, the thickness of the stress relaxation layer 87A is larger than the average thickness of the other Au layers in the second layer portion 86A.

Here, the Au layer has a stress in opposite direction to the stress of an Sn layer. In the case that the stress of one of the Au layer and the Sn layer in the second layer portion is larger than the stress of the other, a stress is applied to a package when the prism is joined to the package. The larger the number of the Au layers and the Sn layers in the second layer portion is, the larger the stress is.

In the present embodiment, the second layer portion 86A includes the stress relaxation layer 87A. As a result, magnitude relationship between the total stress of the plurality of Au layers and the total stress of the plurality of Sn layers can be nearly an equal relationship. Therefore, when the prism is mounted, the stress applied to the package can be relaxed. As a result, the prism rarely separates from the package.

The adhesive film 83A includes the stress relaxation layer 87A, and as a result, the total stress of the Au layer can be adjusted to be large. Therefore, the present embodiment is suitable for a case in which the total stress of the Sn layer is large. The stress relaxation layer 87A preferably has a thickness of ½ or more and 5 or less times the average thickness of the other Au layers. As a result, when the prism is mounted on a package or the like, the stress applied to the package or the like can be effectively relaxed, and separation of the prism from the package or the like can be effectively suppressed.

For example, the thicknesses of the plurality of Au layers other than the stress relaxation layer 87A may be the same, and the thicknesses of the plurality of Sn layers may be the same. In this case, when an adhesive film 93 is formed, only the stress relaxation layer 87A is to have a different thickness from the thicknesses of the other Au layers. Therefore, the manufacturing process can be simplified. As a result, the productivity can be enhanced, and the prism rarely separates from the package or the like. However, the thicknesses of the plurality of Au layers other than the stress relaxation layer 87A are not to be the same, and the thicknesses of the plurality of Sn layers are not to be the same.

Also in the present embodiment, the prism can be joined to the package or the like without melt of the adhesive film 83A in the same manner as in the first embodiment. Therefore, the positional accuracy of the prism can be effectively enhanced.

Hereinafter, ninth to eleventh embodiments different from the present embodiment only in the configuration of the stress relaxation layer will be described. Also in the ninth to eleventh embodiments, in the same manner as in the present embodiment, the positional accuracy of a prism can be effectively enhanced, and the prism rarely separates from a package or the like.

Ninth Embodiment

FIG. 11 is a sectional view of a prism according to a ninth embodiment. As illustrated in FIG. 11, also in the present embodiment, a stress relaxation layer 87B in a second layer portion 86B in an adhesive film 83B corresponds to a third layer that is one of a plurality of Au layers. The thickness of the stress relaxation layer 87B is smaller than the average thickness of the Au layers other than the stress relaxation layer 87B in the second layer portion 86A.

The adhesive film 83B includes the stress relaxation layer 87B, and as a result, the total stress of the Au layer can be adjusted to be small. Therefore, the present embodiment is suitable for a case in which the total stress of the Sn layer is small. The stress relaxation layer 87B preferably has a thickness of ⅕ or more and ½ or less times, and more preferably ⅕ or more and ¼ or less times the average thickness of the other Au layers. As a result, when the prism is mounted on a package or the like, the stress applied to the package or the like can be effectively relaxed, and separation of the prism from the package or the like can be effectively suppressed.

Tenth Embodiment

FIG. 12 is a sectional view of a prism according to a tenth embodiment. As illustrated in FIG. 12, a stress relaxation layer 87C in a second layer portion 86C in an adhesive film 83C in the present embodiment corresponds to a fourth layer that is one of a plurality of Sn layers. The thickness of the stress relaxation layer 87C is larger than the average thickness of the Sn layers other than the stress relaxation layer 87C in the second layer portion 86C.

The adhesive film 83C includes the stress relaxation layer 87C, and as a result, the total stress of the Sn layer can be adjusted to be large. Therefore, the present embodiment is suitable for a case in which the total stress of the Au layer is large. The stress relaxation layer 87C preferably has a thickness of ½ or more and 5 or less times the average thickness of the other Sn layers. As a result, when the prism is mounted on a package or the like, the stress applied to the package or the like can be effectively relaxed, and separation of the prism from the package or the like can be effectively suppressed.

Eleventh Embodiment

FIG. 13 is a sectional view of a prism according to an eleventh embodiment. As illustrated in FIG. 13, also in the present embodiment, a stress relaxation layer 87D in a second layer portion 86D in an adhesive film 83D corresponds to a fourth layer that is one of a plurality of Sn layers. The thickness of the stress relaxation layer 87D is smaller than the average thickness of the Sn layers other than the stress relaxation layer 87D in the second layer portion 86D.

The adhesive film 83D includes the stress relaxation layer 87D, and as a result, the total stress of the Sn layer can be adjusted to be small. Therefore, the present embodiment is suitable for a case in which the total stress of the Au layer is small. The stress relaxation layer 87D preferably has a thickness of ⅕ or more and ½ or less times, and more preferably ⅕ or more and ⅓ or less times the average thickness of the other Sn layers. As a result, when the prism is mounted on a package or the like, the stress applied to the package or the like can be effectively relaxed, and separation of the prism from the package or the like can be effectively suppressed.

In the above-described embodiments, an example is shown in which the second layer portion in the adhesive film includes at least one of the Au layer or the Sn layer. In the second layer portion in the adhesive film, the metals in the Au layer and the Sn layer may be alloyed. An example of this case will be shown below.

Twelfth Embodiment

FIG. 14 is a sectional view of a prism according to a twelfth embodiment. As illustrated in FIG. 14, the present embodiment is different from the first embodiment in that a second layer portion 96 is an Au—Sn layer including an alloy of Au and Sn, and that an adhesive film 93 includes an outermost layer portion 98. The second layer portion 96 is laminated with the outermost layer portion 98. The outermost layer portion 98 is an Au layer. Except for the above-described points, a prism 91 of the present embodiment has the same configuration as the prism 1 of the first embodiment.

In forming the second layer portion 96 in the adhesive film 93, for example, an Au layer and an Sn layer are to be alternately stacked, and then the stacked Au layer and Sn layer are to be heated. Thus, the metals in the Au layer and the Sn layer are alloyed to form the second layer portion 96.

In the present embodiment, the outermost layer portion 98 is the outermost layer of the adhesive film 93. The outermost layer portion 98 can be formed with, for example, a sputtering method or a vacuum deposition method. The adhesive film 93 may include no outermost layer portion 98. In this case, the outermost layer of the second layer portion is the outermost layer of the adhesive film in the same manner as in the other embodiments such as the first embodiment. Specifically, when the second layer portion 96 is an Au—Sn layer as in the present embodiment and no outermost layer portion 98 is included, the Au—Sn layer is the outermost layer.

Similarly to the prisms of the other embodiments, the prism 91 is mounted on a package or the like. Also in the present embodiment, the prism 91 can be joined to the package or the like without melt flow of the entire adhesive film 93. Therefore, the positional accuracy of the prism 91 can be effectively enhanced.

The second layer portion 96 in the adhesive film 93 preferably has a thickness of 2.5 µm or more and 5.9 µm or less. As a result, when the prism 91 is mounted on the package or the like, the joining strength by the adhesive film 93 can be sufficiently enhanced. The first layer portion preferably has a thickness of 0.1 or more and 0.5 µm or less. The adhesive film preferably has a total thickness of 3 µm or more and 6 µm or less.

As in the present embodiment, the adhesive film 93 preferably includes the outermost layer portion 98. In the present embodiment, the second layer portion 96 that is an Au—Sn layer is laminated with the outermost layer portion 98 that is an Au layer. In this case, the portion in contact with the package or the like at the time of mounting is the outermost layer portion 98. Therefore, at the time of mounting, the adhesive film 93 rarely oxidizes to enhance the joining strength by the adhesive film 93 further reliably.

Also in the present embodiment, an intermediate layer portion may be interposed between a first layer portion 5 and the second layer portion 96 in the same manner as in the fifth embodiment. As a result, the metal in the second layer portion 96 rarely diffuses into the first layer portion 5. Therefore, the adhesive film 93 rarely separates from the prism body 2.

Thirteenth Embodiment

FIG. 15 is a sectional view of a prism according to a thirteenth embodiment. As illustrated in FIG. 15, the present embodiment is different from the first embodiment in that a protective film 105 is provided on the ridge between a bottom surface 2a and an inclined surface 2b of a prism body 2. Except for the above-described point, the prism of the present embodiment has the same configuration as the prism 1 of the first embodiment.

The protective film 105 is provided integrally with a reflective film 4. The protective film 105 is connected to an adhesive film 3. Note that the protective film 105 is not necessarily to be connected to the adhesive film 3. The protective film 105 can be formed with, for example, a sputtering method or a vacuum deposition method. In the case that the protective film 105 is integrated with the reflective film 4 as in the present embodiment, the protective film 105 can be formed simultaneously with the reflective film 4.

However, the protective film 105 may be provided separately from the reflective film 4. Alternatively, the protective film 105 may be provided integrally with the adhesive film 3. In this case, the protective film 105 may be connected to the reflective film 4 or not connected to the reflective film 4. The protective film 105 integrated with the adhesive film 3 has at least one of the same plurality of layers as those in the adhesive film 3.

In the prism including the protective film 105, the prism body 2 rarely has a chip. The protective film 105 is preferably connected to both the reflective film 4 and the adhesive film 3. As a result, the prism body 2 further rarely has a chip.

Also in the present embodiment, the prism can be joined to a package or the like without melt of the adhesive film 3 in the same manner as in the first embodiment. Therefore, the positional accuracy of the prism can be effectively enhanced.

Evaluation of Joining Strength

In the prism 1 of the first embodiment illustrated in FIG. 1, the outermost layer of the second layer portion 6, as the outermost layer of the adhesive film 3, was varied in the arithmetic average roughness Ra, and the joining property to the package was confirmed. The outermost layer of the adhesive film 3 was an Au layer. Specifically, the arithmetic average roughness Ra of the outermost layer, represented by Ra, was set to Ra≤0.05, 0.05<Ra≤0.09, 0.09<Ra≤0.15, and 0.15<Ra≤0.20. The arithmetic average roughness Ra in the present description is in accordance with JIS B 0601: 2013.

In the confirmation of the joining property, an aluminum nitride substrate having an Au-plated portion was used as a package. The prism 1 was joined to the Au-plated portion of the aluminum nitride substrate through heating to about 320° C. Then, a force was applied from the side surface of the prism 1. Specifically, a force was applied to the prism 1 until the adhesive film 3 of the prism 1 separated from the aluminum nitride substrate, until the prism body 2 separated from the adhesive film 3, or until the prism body 2 was broken without separation. The joining property was confirmed 15 times in each case in which the arithmetic average roughness Ra was varied. Table 1 shows the results.

In Table 1, "Excellent" is the symbol for the highest evaluation of the joining property, "Good" is the symbol for the second highest evaluation, and "Fair" is the symbol for the lowest evaluation. The phrase "no separation" means that the adhesive film 3 is not separated from the package, and also refers to a case in which the prism body 2 is broken and a case in which the prism body 2 is separated from the adhesive film 3. The phrase "partial separation" means that a part of the adhesive film 3 is separated from the package.

TABLE 1

| Ra[µm] | Result | Evaluation |
| --- | --- | --- |
| Ra ≤ 0.05 | No separation: 100% | Excellent |
| 0.05 < Ra ≤ 0.09 | No separation: 50%, partial separation: 50% | Good |
| 0.09 < Ra ≤ 0.15 | No separation: 25%, partial separation: 75% | Good |
| 0.15 < Ra ≤ 0.20 | No separation: 10% or less, partial separation: 90% or more | Fair |

As shown in Table 1, it is found that in each case in which the arithmetic average roughness Ra of the outermost layer of the adhesive film 3 was varied, the result is "no separation" or "partial separation", that is, the adhesive film 3 is not completely separated from the package. Furthermore, it is found that the smaller the value of the arithmetic average roughness Ra of the outermost layer is, the larger the proportion of "no separation" is.

The arithmetic average roughness Ra of the outermost layer of the adhesive film 3 is preferably 0.20 μm or less, more preferably 0.15 μm or less, still more preferably 0.09 μm or less, and particularly preferably 0.05 μm or less. As a result, at the time of mounting, the adhesion property of the adhesive film 93 to the package or the like can be further effectively enhanced. Therefore, the joining strength can be further effectively enhanced.

In the twelfth embodiment illustrated in FIG. 14, even if the adhesive film 93 includes no outermost layer portion 98, the second layer portion 96 as the outermost layer of the adhesive film 93 also preferably has an arithmetic average roughness Ra within the above-described range. As a result, the joining strength can be further effectively enhanced.

Evaluation of Stress

The magnitude of the stress of the adhesive film of the prism was evaluated. A base material of a prism 91A extending in the direction in which both the side surfaces face each other as illustrated in FIG. 16 was attached to a dicing sheet. Next, the base material of a prism 91A was cut along alternate long and short dash lines I-I and divided into pieces. The prism after the division has the same configuration as the prism of the twelfth embodiment illustrated in FIG. 14. If the stress of the adhesive film 93 to the package is large, the impact at the time of releasing stress during division is large, and therefore, the prism easily separates from the package. Therefore, the larger the proportion of separation is, the larger the stress of the adhesive film 93 is.

The stress was evaluated under the conditions 1 to 4 in which the second layer portion 96 in the adhesive film 93 was varied in the thickness or the like. Specifically, in the condition 1, the thickness of the second layer portion 96 was 3 μm, and in the conditions 2 to 4, the thickness of the second layer portion 96 was 6 μm. Furthermore, in the condition 3 and the condition 4, heat treatment was performed before the base material of a prism 91A was attached to the dicing sheet. Specifically, in the condition 3, the heat treatment was performed at 200° C. for 2 hours under a nitrogen atmosphere. In the condition 4, the heat treatment was performed at 200° C. for 5 hours under a nitrogen atmosphere. Table 2 shows the results of the evaluation of the magnitude of stress.

In Table 2, "Excellent" is the symbol for the smallest stress, "Good" is the symbol for the second smallest stress, and "Fair" is the symbol for the largest stress.

TABLE 2

| Thickness of Au—Sn layer [μm] | Heat treatment | Proportion of separation | Evaluation |
|---|---|---|---|
| 3 | — | 10-30% | Good |
| 6 | — | 30-50% | Fair |
| 6 | 200° C./2 h under nitrogen atmosphere | 20-40% | Fair |
| 6 | 200° C./5 h under nitrogen atmosphere | 0-5% | Excellent |

As shown in Table 2, in each of the conditions 1 to 4, the proportion of separation of the prism 91 from the package is suppressed to 50% or less. Furthermore, comparison between the condition 1 and the condition 2 in which the thicknesses of the second layer portions 96 are different shows that the stress is smaller in the condition 1 in which the second layer portion 96 is thinner. As described above, it is found that the thinner the second layer portion 96 is, the smaller the stress of the adhesive film 93 is. The thickness of the second layer portion 96 of the adhesive film 93 is preferably 6 μm or less, and more preferably 3 μm or less. As a result, the stress can be further reduced.

Comparison between the condition 2 and the condition 3 in which the thicknesses of the second layer portions 96 are the same shows that the stress is smaller in the condition 3 in which the heat treatment was performed before the base material of a prism 91A was attached to the dicing sheet. Furthermore, comparison between the condition 3 and the condition 4 in which the thicknesses of the second layer portions 96 are the same and the heat treatment was performed shows that the stress is smaller in the condition 4 in which the time of the heat treatment is longer. As described above, it is found that the longer the time of the heat treatment is, the more the stress can be suppressed. The heat treatment is preferably performed before the prism is attached to the dicing sheet, and the heat treatment is preferably performed for about 2 hours to 5 hours. As a result, the stress can be further effectively suppressed.

DESCRIPTION OF REFERENCE SYMBOLS 1, 11, 21, 31, 41, 51, 61, 91 Prism
2 Prism body
2a Bottom surface
2b Inclined surface
2c Top surface
3, 13, 23, 33, 43, 83A to 83D, 93 Adhesive film
4 Reflective film
5 First layer portion
6, 16, 26, 36, 86A to 86D, 96 Second layer portion
6a, 16a, 26a, 36a First layer
6b, 16b, 26b, 36b Second layer
6c, 16c, 26c, 36c Third layer
6d, 16d, 26d, 36d Fourth layer
6e, 16e, 26e, 36e Fifth layer
47 Intermediate layer portion
70 Optical device
74 Optical element
75 Package
76 Bottom portion
76a Mounting surface
77 Side wall portion
77a Inner surface
78 Metal film
79 Lid
87A to 87D Stress relaxation layer
98 Outermost layer portion
91A Base material of a prism
105 Protective film

The invention claimed is:

1. A prism comprising:
a prism body having a bottom surface and an inclined surface connected to the bottom surface; and
an adhesive film provided on the bottom surface,
the adhesive film including:
a first layer portion positioned on a side facing the prism body, and a second layer portion including at least one Au layer and Sn layer, wherein the first layer portion and the second layer portion are directly or indirectly stacked, and the Au layer and the Sn layer are alternately stacked in the second layer portion.

2. The prism according to claim 1, wherein the second layer portion includes an Au—Sn layer including an alloy of Au and Sn provided between the Au layer and the Sn layer.

3. The prism according to claim 1, wherein the second layer portion includes the Au layer as an outermost layer that is farthest from the prism body in a stacking direction of the adhesive film.

4. The prism according to claim 1, wherein the second layer portion includes both a plurality of the Au layers and a plurality of the Sn layers alternately stacked, the second layer portion includes a stress relaxation layer, the stress relaxation layer in a case that the stress relaxation layer is one of the plurality of the Au layers has a thickness different from an average thickness of a plurality of the Au layers other than the stress relaxation layer, and the stress relaxation layer in a case that the stress relaxation layer is one of the plurality of the Sn layers has a thickness different from an average thickness of a plurality of the Sn layers other than the stress relaxation layer.

5. The prism according to claim 4, wherein the stress relaxation layer has a thickness of ½ or more and 5 or less times the average thickness of the plurality of the Au or Sn layers other than the stress relaxation layer.

6. The prism according to claim 4, wherein the stress relaxation layer has a thickness of ⅕ or more and ½ or less times the average thickness of the plurality of the Au or Sn layers other than the stress relaxation layer.

7. The prism according to claim 1, wherein an outermost layer of the second layer portion farthest away from the prism body is thinner than any other layer in the second layer portion.

8. The prism according to claim 7, wherein each layer of the second layer portion is thinner than a layer in the second layer portion nearer to the prism body.

9. The prism according to claim 3, wherein the second layer portion includes both a plurality of the Au layers and a plurality of the Sn layers, the plurality of the Au layers have a same thickness, and each of the plurality of the Sn layers in the stacking direction is thicker than an Sn layer nearer to the prism body.

10. The prism according to claim 3, wherein the second layer portion includes both a plurality of the Au layers and a plurality of the Sn layers, each of the plurality of the Au layers in the stacking direction is thinner than an Au layer nearer to the prism body, and the plurality of the Sn layers have a same thickness.

11. The prism according to claim 1, wherein the second layer portion includes 3 or more and 99 or less layers of the Au layer and the Sn layer in total.

12. The prism according to claim 11, wherein the second layer portion includes 15 or more and 35 or less layers of the Au layer and the Sn layer in total.

13. The prism according to claim 1, wherein the adhesive film has a total thickness of 1 µm or more and 10 µm or less.

14. The prism according to claim 1, wherein the second layer portion has a total weight of Au, represented by $M_A$, and a total weight of Sn, represented by $M_S$, so that a ratio of the total weight of Au to a total weight of Au and Sn, represented by $M_A/(M_A+M_S)$, is 0.60 or more and 0.78 or less.

15. The prism according to claim 1, wherein the first layer portion is a Cr layer, a Ti layer, or a Ta layer.

16. The prism according to claim 1, wherein the adhesive film further includes an intermediate layer portion interposed between the first layer portion and the second layer portion.

17. The prism according to claim 16, wherein the intermediate layer portion is an Ni layer, a Pt layer, a Pd layer, an Ni—Cr mixed layer, or an alloy layer in which Ni, Pt, Pd, and Cr are combined.

18. The prism according to claim 1, wherein the prism body has a top surface, and the top surface is opposite from the bottom surface and is connected to the inclined surface.

19. The prism according to claim 1, wherein a reflective film is provided on the inclined surface of the prism body.

20. The prism according to claim 18, wherein a reflective film is provided on the inclined surface and the top surface of the prism body.

21. An optical device comprising:

the prism according to claim 1;

an optical element that emits light to the prism or receives light from the prism; and a package that houses the prism and the optical element, wherein the prism is joined to the package via the adhesive film.

22. A method for manufacturing a package device, the method comprising:

a step of preparing the prism according to claim 1;

a step of preparing a package having an adhesive surface to be adhered to the prism;

a step of bringing the prism and the package into contact with each other so that the adhesive film comes into contact with the adhesive surface of the package; and a step of heating the adhesive film to join the prism to the package.

23. The method according to claim 22, wherein an Au film is formed on the adhesive surface of the package, and the step of heating is performed at a temperature at which a whole of the adhesive film is not melted to join the prism to the package.

24. A prism to be mounted on a package, the prism comprising:

a prism body having a bottom surface and an inclined surface connected to the bottom surface; and an adhesive film provided on the bottom surface, the adhesive film including:

a first layer portion positioned on a side facing the prism body, and a second layer portion being an Au—Sn layer including an alloy of Au and Sn, wherein the second layer portion has a thickness of 2.5 µm or more and 5.9 µm or less, the first layer portion and the second layer portion are directly or indirectly stacked, and the adhesive film includes an outermost layer farthest away from the prism body in a stacking direction of the adhesive film, and the outermost layer has an arithmetic average roughness, represented by Ra, of 0.20 µm or less.

25. The prism according to claim 24, wherein the adhesive film includes an outermost layer portion as an outermost layer that is farthest from the prism body in the stacking direction of the adhesive film, the second layer portion is laminated with the outermost layer portion, and the outermost layer portion is an Au layer.

26. A method for manufacturing a prism, the method comprising a step of providing an adhesive film on a bottom surface of a prism body having the bottom surface and an inclined surface connected to the bottom surface, the step including a step of forming a first layer portion including a metal material on the bottom surface and a step of directly or indirectly stacking the first layer portion and a second layer portion including a metal material, wherein a component contained in the metal material included in the first layer portion is different from a component contained in the metal material included in the second layer portion, the second layer portion includes at least one Au layer and Sn layer, and the Au layer and the Sn layer are alternately stacked in the second layer portion.

* * * * *